United States Patent [19]
Yoshihara et al.

[11] Patent Number: 4,606,949
[45] Date of Patent: Aug. 19, 1986

[54] COATING METHOD

[75] Inventors: Toshiyuki Yoshihara, Mitaka; Yuichi Yashiki, Yokohama; Motomu Horii, Abiko; Mutsuo Ohtaka, Ryugasaki, all of Japan

[73] Assignee: Canon Kabushiki Kaisha, Tokyo, Japan

[21] Appl. No.: 629,890

[22] Filed: Jul. 11, 1984

[30] Foreign Application Priority Data

Jul. 18, 1983 [JP] Japan ................................ 58-130453

[51] Int. Cl.⁴ .............................................. B05D 1/18
[52] U.S. Cl. .................. 427/430.1; 118/404; 118/612
[58] Field of Search .............. 427/430.1; 118/429, 118/405, 612, 404; 366/319, 320

[56] References Cited

U.S. PATENT DOCUMENTS

| 62,899 | 3/1867 | Stanton | 366/320 X |
| 1,521,044 | 12/1924 | Parker | 366/319 X |
| 3,457,070 | 7/1969 | Watanabe et al. | 430/55 |
| 3,539,385 | 11/1970 | Hunter et al. | 118/612 X |
| 3,803,084 | 4/1974 | Schnurrbusch et al. | 366/320 X |

Primary Examiner—Shrive P. Beck
Attorney, Agent, or Firm—Fitzpatrick, Cella, Harper & Scinto

[57] ABSTRACT

A coating method characterized in that an object of coating is dipped in a coating liquid so as to be positioned in the region surrounded by a helical agitator blade which is being revolved around the axis of the helix in the coating liquid to uniform the composition thereof.

7 Claims, 4 Drawing Figures

COATING METHOD

BACKGROUND OF THE INVENTION

Field of the Invention

The present invention relates to a coating method for forming coats on surfaces of objects.

The dip coating method is widely used as an advantageous method for applying coating materials on surfaces of objects. However, when a thin coat, for example, up to 50μ thick is formed by dip coating, a considerable unevenness will be observed in the thickness of the resulting coat on account of the solvent evaporation at the surface of the coating liquid in the dip coating bath. In dip coating by use of a dispersion type of coating liquid such as a pigment dispersion in a binder resin solution, the composition of the coating liquid will become nonuniform if sedimentation of the pigment occurs, and therefore, the composition of the coat resulting from such a coating liquid will be also nonuniform. Although the above drawbacks can be eliminated by constant stirring of the coating liquid in the coating bath during operation, the stirring is troublesome since it ruffles the coating liquid.

SUMMARY OF THE INVENTION

The primary object of the invention is to provide a dip coating method which permits forming uniform coats by effective stirring coating liquids in coating baths.

According to the present invention, there is provided a coating method characterized in that an object of coating is dipped in a coating liquid so as to be positioned in the region surrounded by a helical agitator blade which is being revolved around the axis of the helix in the coating liquid to render uniform the composition thereof.

DETAILED DESCRIPTION OF THE PREFERRED EMBODIMENT

According to the coating method of the invention, an object of coating is dipped in a coating liquid contained in a coating bath so as to be surrounded by a helical agitator blade without contact therewith. The coating liquid composition is rendered uniform by constant revolution of the blade around the axis of the helix, whereby the uniformity of the resulting coat is secured. The term "helical agitator blade" herein means a blade having a coiled spring-like form. The dipped object is then withdrawn from the coating liquid by lifting the object itself or by bringing down the coating bath.

Figure 1:
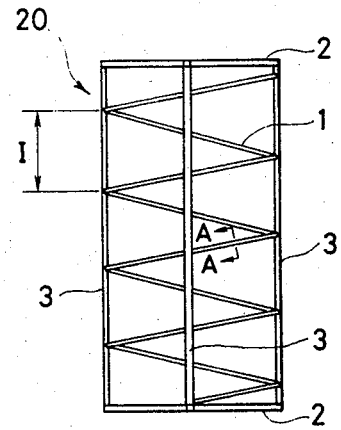
FIG. 1 is a side view of an example of the agitator body used in the invention.
Figure 2:
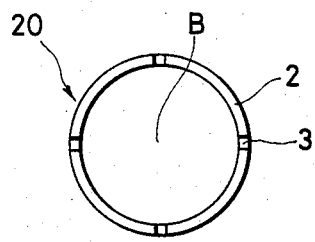
FIG. 2 is a plan view of the agitator body shown in FIG. 1.
Figure 3:
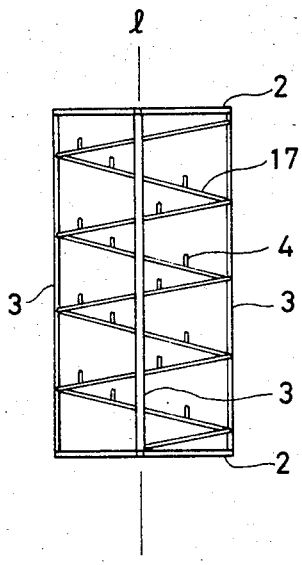
FIG. 3 is a side view of another example of the agitator body used in the invention.

FIG. 1 illustrates a typical form of the helical agitator body used in the coating method of this invention. This form of agitator body 20 comprises a helical blade 1, two annular supports 2 holding the blade 1 at the upper and lower ends thereof, and four vertical supports 3 which are joined with the blade 1 and the annular supports 2. The cross-section of the blade 1 taken on line A—A of FIG. 1 may have any of rectangular, circular, elliptical, polygonal, and other possible forms, but a thin rectangular form is preferable. The blades shown in FIGS. 1-4 have rectangular cross-sections. FIG. 2 is a plan view of the agitator body 20 shown in FIG. 1. The helical blade 17 shown in FIG. 3 has, in addition to the same blade as the helical blade 1 shown in FIG. 1, a number of small projections 4 protruding parallel to the axis l of the helical blade 17 for the purpose of enhancing the agitation effect. The projections 4 are not necessarily parallel to the axis l. The object to be coated is set in the interior room of the agitator body 20 which is in revolution. The interior room herein means the region B surrounded by the helical blade 1 (see FIG. 2). The coating liquid in the interior room is moved upward by the revolution of the helical blade 1, contributing to the uniformity of the coating liquid 7, especially to the prevention of pigment sedimentation when the coating liquid is of the dispersion type. Excessive speeds of the revolution unfavorably ruffle the coating liquid. Suitable speeds of the revolution range from 1 to 60 rpm. The pitch I (FIG. 1) (period of winding) of the helical blade 1 is suitably designated according to the dispersion state, viscosity, speed of application (dipping period), etc., of the coating liquid. The stirring of the coating liquid with an agitator as described above is highly effective since the coating liquid even in the vicinity of the surface thereof is also stirred sufficiently, this being important for this type of coating. When the coating liquid is stirred with an agitator of other types, for example, an agitator having propeller-like blades, the object to be coated cannot be introduced from the upper side of the agitator since the blades and the propeller shaft obstruct it usually. Accordingly, the propeller shaft needs to be inserted from the lower side of the coating bath through the bottom thereof. In this case, a complicated device is necessary to prevent liquid leakage, and agitator blades positioned on the bottom side exert a limited stirring effect on the uppermost zone of the coating liquid.

The helical agitator blade is desirably always revolved in the absence of the object of coating, of curse, and also during the sinking of the object of coating. The revolution may be continued also during the uptake of the object, where the revolution speed is preferably controlled so as not to ruffle the coating liquid at all. In this case, suitable speeds of the revolution are approximately 1-20 rpm and revolution speeds different from those in the absence of the object of coating are also acceptable.

According to the dip coating method of the invention, good quality coats very uniform in thickness and in composition can be obtained by stirring the coating liquid with a helical agitator blade as described above.

EXAMPLE 1

Aluminum cylinders of 80 mmφ×300 mml were prepared as substrates for coating.

Then, a coating dispersion was prepared by mixing and dispersing the following materials through a roll mill were the roll gap was adjusted to 40μ.

| | |
|---|---|
| Photoconductive CdS | 100 parts by wt. |
| Vinyl chloride-vinyl acetate copolymer (supplied by Union Carbide Corp. under the tradename VMCH) | 14 parts by wt. |
| Methyl ethyl ketone | 30 parts by wt. |

| | |
|---|---|
| -continued | |
| Methyl isobutyl ketone | 30 parts by wt. |

Figure 4:
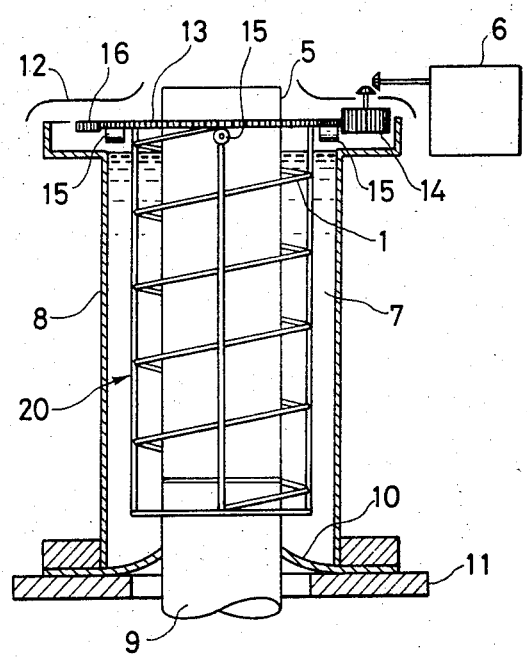
FIG. 4 is a side view of an example of the applicator used in the invention.

A schematic diagram of the applicator used is shown in FIG. 4.

The cylinder 5, the object to be coated, is set on a piston 9, which is movable up and down for applying a coating liquid 7 around the cylinder 5. A packing 10 is fixed on a base plate 11 to contact with the piston 9 intimately, thereby preventing the leakage of the coating liquid from a cylindrical coating bath 8 containing it. The inner diameter of the coating bath 8 is 140 mm and the space between the inner wall of the bath 8 and the surface of the cylinder 5 is 30 mm.

The helical agitator blade 1 used in this example has a rectangular cross section and is 10 mm in width and 1 mm in thickness (the vertical dimension) and the agitator body 20 comprising the blade 1 is 100 mm in inner diameter, 120 mm in outer diameter, and 300 mm in height. As shown in FIG. 4, the agitator frame 20 is interlocked with a driving system 6 through gears 13 and 14, which are attached on the top of the agitator body 20. The driving system 6 is designed to set the agitator revolution speed freely with a stepless speed changer. The agitator body 20 is supported by rollers 15 which are mounted on the supper flange of coating bath 8. That is, the rollers 15 bear the gear 13 which is attached to the top of the agitator body 20. A gear 16 is mounted on the upper flange of the coating bath 8 and at the position opposite to the gear 14, and engages with the gear 13, thereby preventing the horizontal deviation of the gear 13. In lieu of the gear 16, a groove for accepting the rollers 15 can be formed in the gear 13 to prevent the horizontal deviation. The coating bath 8 is equipped with a cover 12 on the top thereof to prevent the contamination with dust.

Using this applicator at a revolution speed of 30 rpm of the helical agitator blade 1, the coating liquid was applied on a specimen of the aluminum cylinders so as to give a dry thickness of $35\mu$ and was dried at 80° C. for 20 minutes.

Thickness of the resulting coat was measured to examine the variation of thickness with respect to the axial and circumferential directions. The found thickness was very uniform, as uniform as $35\pm0.5\mu$ throughout the entire area of the coat.

For comparison, coating was carried out similarly but using no agitator and the thickness of the resulting coat was measured. The found thickness was $35\pm4\mu$ (the deviation $\pm4\mu$ is with respect to the axial direction), that is, the variation of thickness was large, and irregularities due to the nonuniform dispersion in the coating liquid were observed with the naked eye.

The coat (photosensitive layer) formed by using the helical agitator blade 1 was covered with a heat-shrinkable poly-(ethylene terephthalate) tube of $20\mu$ in film thickness and 120 mm$\phi$ (supplied by Kalle AG. under the tradename Hostaphaushrink Film) and the tube was shrunk by heating at 100° C. for 30 minutes to form the coat covered with the shrunk insulation film.

Using the thus prepared photosensitive drum, images were formed by repeating the following electrophotographic process: a latent image was formed on the photosensitive drum by the primary $\oplus$DC charge, secondary simultaneous AC charge elimination and image exposure, and overall uniform illumination. Then, the latent image was developed and transferred and the drum was cleaned. The resulting images showed good uniform quality having even density and were also uniform in electrophotographic characteristics such as potential, because of little uneveness is the thickness of the photosensitive layer.

The coating liquid in the vessel was left for 2 hours without dipping any object of coating, where the helical agitator was revolved or not revolved. In the case with the revolution, the composition of the coating liquid was kept uniform. But in the case without revolution, the sedimentation of CdS fine particles onto the bottom of the bath was observed. In consequence, the composition of the coating liquid changed to less CdS concentration. Thus, the helical agitator blade according to this invention is advantageous in that the coating liquid can be kept homogeneous in both cases where the object of coating is dipped and not dipped.

What we claim is:

1. A coating method for forming a photosensitive layer on an object to be coated comprising the steps of disposing a helical agitator blade in a container holding a coating liquid, dipping the object down into the coating liquid so as to position the object in the region surrounded by the helical agitator blade, homogenizing the coating liquid by revolving the helical agitator blade while the object is being dipped in the coating liquid, and withdrawing the object upwardly out of the container.

2. The coating method of claim 1, wherein the helical agitator blade has a rectangular cross section.

3. The coating method of claim 1, wherein said object is cylindrical.

4. The coating method of claim 1, wherein the revolution speed of the helical agitator blade is in the range of 1 to 60 rpm.

5. The coating method of claim 1, wherein the helical agitator blade is revolved during the lowering of the object in the coating liquid.

6. The coating method of claim 1, wherein the helical agitator blade is revolved during the uptake of the object from the coating liquid.

7. The coating method of claim 6, wherein the revolution speed of the helical agitator blade is in the range of 1 to 20 rpm.

* * * * *

UNITED STATES PATENT AND TRADEMARK OFFICE
CERTIFICATE OF CORRECTION

PATENT NO. : 4,606,949
DATED : August 19, 1986
INVENTOR(S) : TOSHIYUKI YOSHIHARA, ET AL.

It is certified that error appears in the above-identified patent and that said Letters Patent is hereby corrected as shown below:

Column 1, line 12, change "uneveness" to --unevenness--.

Column 2, line 43, change "curse" to --course--.

Column 3, line 27, change "supper" to --upper--.

Column 4, line 15, change "uneveness" to --unevenness-- and change "is" to --in--.

Signed and Sealed this

Third Day of February, 1987

*Attest:*

DONALD J. QUIGG

*Attesting Officer*  *Commissioner of Patents and Trademarks*